United States Patent
Hosoda et al.

(10) Patent No.: US 10,420,198 B2
(45) Date of Patent: Sep. 17, 2019

(54) EXTREME ULTRAVIOLET LIGHT GENERATING APPARATUS

(71) Applicant: Gigaphoton Inc., Tochigi (JP)

(72) Inventors: Hirokazu Hosoda, Oyama (JP); Toru Suzuki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/895,521

(22) Filed: Feb. 13, 2018

(65) Prior Publication Data

US 2018/0177036 A1 Jun. 21, 2018

Related U.S. Application Data

(63) Continuation of application No. PCT/JP2015/075465, filed on Sep. 8, 2015.

(51) Int. Cl.
*H05G 2/00* (2006.01)
*G03F 7/20* (2006.01)

(52) U.S. Cl.
CPC ............ *H05G 2/008* (2013.01); *H05G 2/006* (2013.01); *G03F 7/70033* (2013.01)

(58) Field of Classification Search
CPC .......... H05G 2/00; H05G 2/001; H05G 2/003; H05G 2/005; H05G 2/006; H05G 2/008; G02F 7/70033; G02F 7/70025
See application file for complete search history.

(56) References Cited

U.S. PATENT DOCUMENTS

| | | | |
|---|---|---|---|
| 2004/0195529 A1 | 10/2004 | Hergenhan et al. | |
| 2006/0192152 A1 | 8/2006 | Ershov et al. | |
| 2006/0192156 A1 | 8/2006 | Hasegawa | |
| 2006/0193997 A1* | 8/2006 | Bykanov | B82Y 10/00 427/585 |
| 2010/0294958 A1 | 11/2010 | Hayashi et al. | |
| 2012/0113313 A1* | 5/2012 | Egawa | G02B 7/36 348/345 |
| 2013/0015319 A1 | 1/2013 | Moriya et al. | |
| 2013/0026393 A1* | 1/2013 | Abe | H05G 2/005 250/504 R |

(Continued)

FOREIGN PATENT DOCUMENTS

| | | |
|---|---|---|
| JP | 2004-303725 A | 10/2004 |
| JP | 2005-310453 A | 11/2005 |

(Continued)

OTHER PUBLICATIONS

International Search Report issued in PCT/JP2015/075465; dated Dec. 15, 2015.

(Continued)

*Primary Examiner* — David E Smith
(74) *Attorney, Agent, or Firm* — Studebaker & Brackett PC

(57) ABSTRACT

The extreme ultraviolet light generating apparatus may include a chamber having a window through which a pulse laser beam enters, a target supply unit configured to output at least one target toward a predetermined region in the chamber, a target image capturing device configured to capture an image of the at least one target, a first actuator configured to move a focused area focused by the target image capturing device, and a controller configured to control the first actuator based on a signal from an external device.

20 Claims, 16 Drawing Sheets

(56) References Cited

U.S. PATENT DOCUMENTS

2013/0256136 A1* 10/2013 Muraki .................. B03C 7/003
  204/555
2015/0261095 A1  9/2015 Jansen et al.
2016/0234920 A1  8/2016 Suzuki et al.

FOREIGN PATENT DOCUMENTS

| | | |
|---|---|---|
| JP | 2007-088267 A | 4/2007 |
| JP | 2009-195310 A | 9/2009 |
| JP | 2012-134447 A | 7/2012 |
| JP | 2013-166266 A | 8/2013 |
| JP | 2014-160670 A | 9/2014 |
| JP | 2014-534559 A | 12/2014 |
| WO | 2010/117861 A1 | 10/2010 |
| WO | 2015/041260 A1 | 3/2015 |

OTHER PUBLICATIONS

International Preliminary Report on Patentability issued in PCT/JP2015/075465; dated Mar. 22, 2018.

An Office Action mailed by the Japanese Patent Office dated May 28, 2019, which corresponds to Japanese Patent Application No. 2017-538505 and is related to U.S. Appl. No. 15/895,521; with English language translation.

* cited by examiner

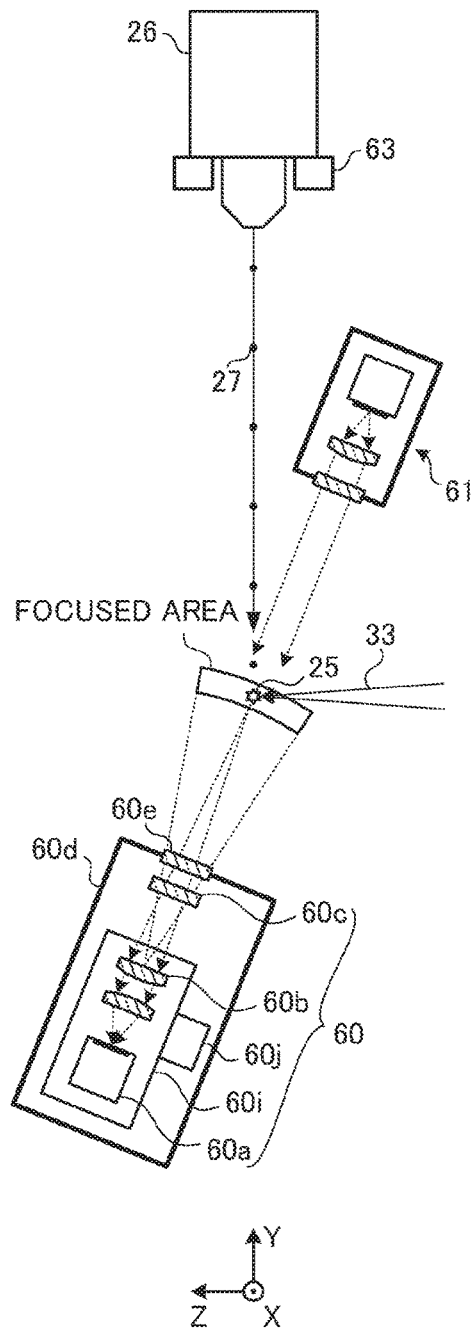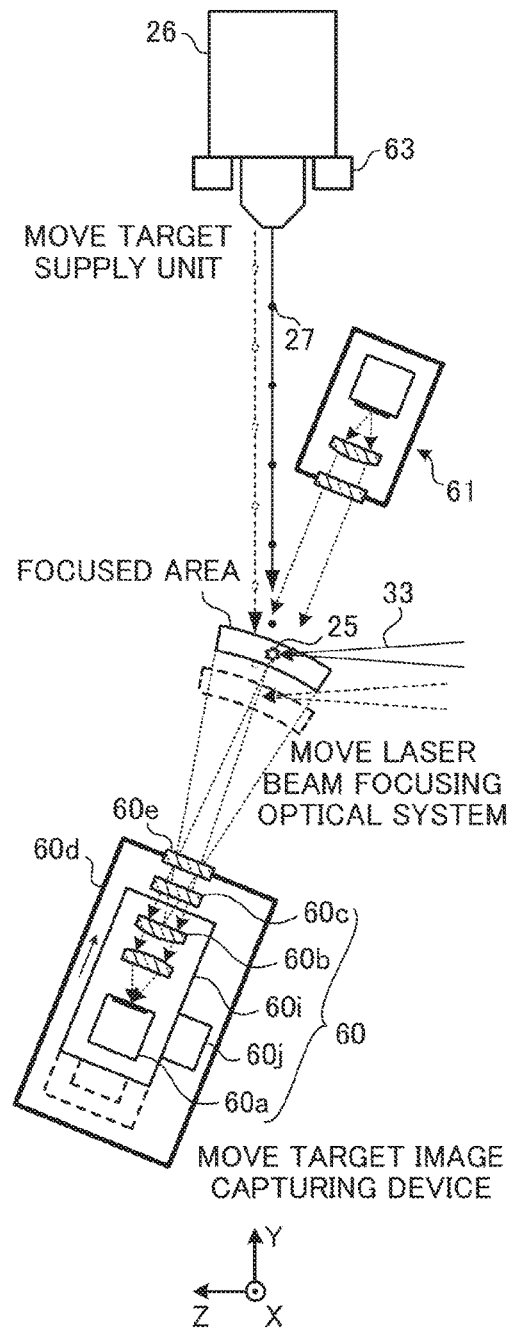

FIG. 12
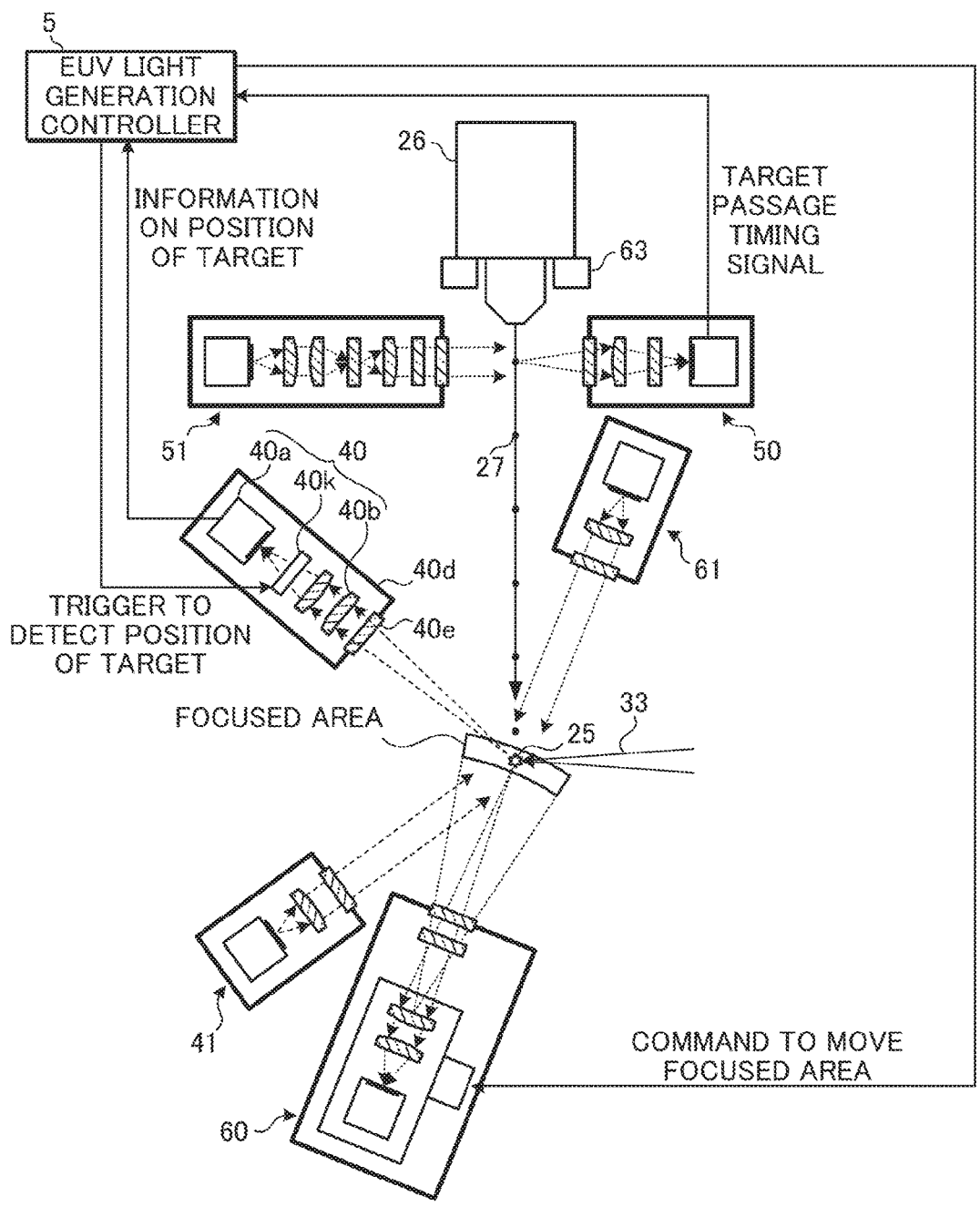
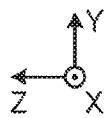

EXTREME ULTRAVIOLET LIGHT GENERATING APPARATUS

TECHNICAL FIELD

The present disclosure relates to an extreme ultraviolet light generating apparatus.

BACKGROUND ART

In recent years, as semiconductor processes become finer, transfer patterns for use in photolithography of semiconductor processes have rapidly become finer. In the next generation, micro-fabrication at 70 nm to 45 nm, and further, micro-fabrication at 32 nm or less would be demanded. In order to meet the demand for, for example, micro-fabrication at 32 nm or less, it is expected to develop an exposure apparatus in which a system for generating extreme ultraviolet (EUV) light at a wavelength of approximately 13 nm is combined with a reduced projection reflective optical system.

Three types of EUV light generating systems have been proposed, which include an LPP (laser produced plasma) type system using plasma generated by irradiating target material with a pulse laser beam, a DPP (discharge produced plasma) type system using plasma generated by an electric discharge, and an SR (synchrotron radiation) type system using synchrotron radiation.

Patent Document 1: International Publication No. 2010/0117861 A
Patent Document 2: US Patent Application Publication No. 2013/0256136 A
Patent Document 3: US Patent Application Publication No. 2010/0294958 A

SUMMARY

An extreme ultraviolet light generating apparatus according to an aspect of the present disclosure may include a chamber having a window through which a pulse laser beam enters, a target supply unit configured to output at least one target toward a predetermined region in the chamber, a target image capturing device configured to capture an image of the at least one target, a first actuator configured to move a focused area focused by the target image capturing device, and a controller configured to control the first actuator based on a signal from an external device.

BRIEF DESCRIPTION OF DRAWINGS

Embodiments of the present disclosure will be described below as mere examples with reference to the appended drawings.

FIGS. 6A and 6B show a target image capturing device, an illumination device, and a target supply unit, included in the EUV light generating apparatus according to the first embodiment of the present disclosure.

FIG. 12 shows a target image capturing device, a target position sensor, a target timing sensor, three illumination devices, and a target supply unit, included in the EUV light generating apparatus according to the third embodiment of the present disclosure.

DESCRIPTION OF EMBODIMENTS

Contents

1. Overall Description of Extreme Ultraviolet Light Generating System
   1.1 Configuration
   1.2 Operation
2. Description of Terms
3. EUV Light Generating Apparatus According to Comparative Example
   3.1 Configuration
      3.1.1 Target Supply Unit
      3.1.2 Target Position Sensor
      3.1.3 Target Timing Sensor
      3.1.4 Target Image Capturing Device
      3.1.5 Laser Beam Direction Control Unit and the Like
   3.2 Operation
      3.2.1 Outputting Target
      3.2.2 Detecting Target Passage Timing
      3.2.3 Calculating Information on Position of Target
      3.2.4 Capturing Image of Target
      3.2.5 Generating Plasma
      3.2.6 Moving Plasma Generation Region
   3.3 Problem 4. Target Image Capturing Device Capable of Moving Focused Area
   4.1 Configuration and Operation
   4.2 Method to Calculate Distance of Moving
   4.3 Effect
5. Control Based on Output from Target Position Sensor
6. Control Based on Output from Target Position Sensor and Target Timing Sensor
7. Target Position Sensor Using Pulsed Illumination
8. Target Image Capturing Device Including High-Speed Shutter
9. Target Image Capturing Device Including Image Conveying Fiber
10. Simultaneous Capturing of Image of a plurality of Targets Embodiments of the present disclosure will be described in detail below with reference to the drawings. The embodiments described below may indicate several examples of the present disclosure and may not intend to limit the content of the present disclosure. Not all of the configurations and operations described in the embodiments are indispensable in the present disclosure.

Identical reference symbols may be assigned to identical constituent elements and redundant descriptions thereof may be omitted.

Figure 1:
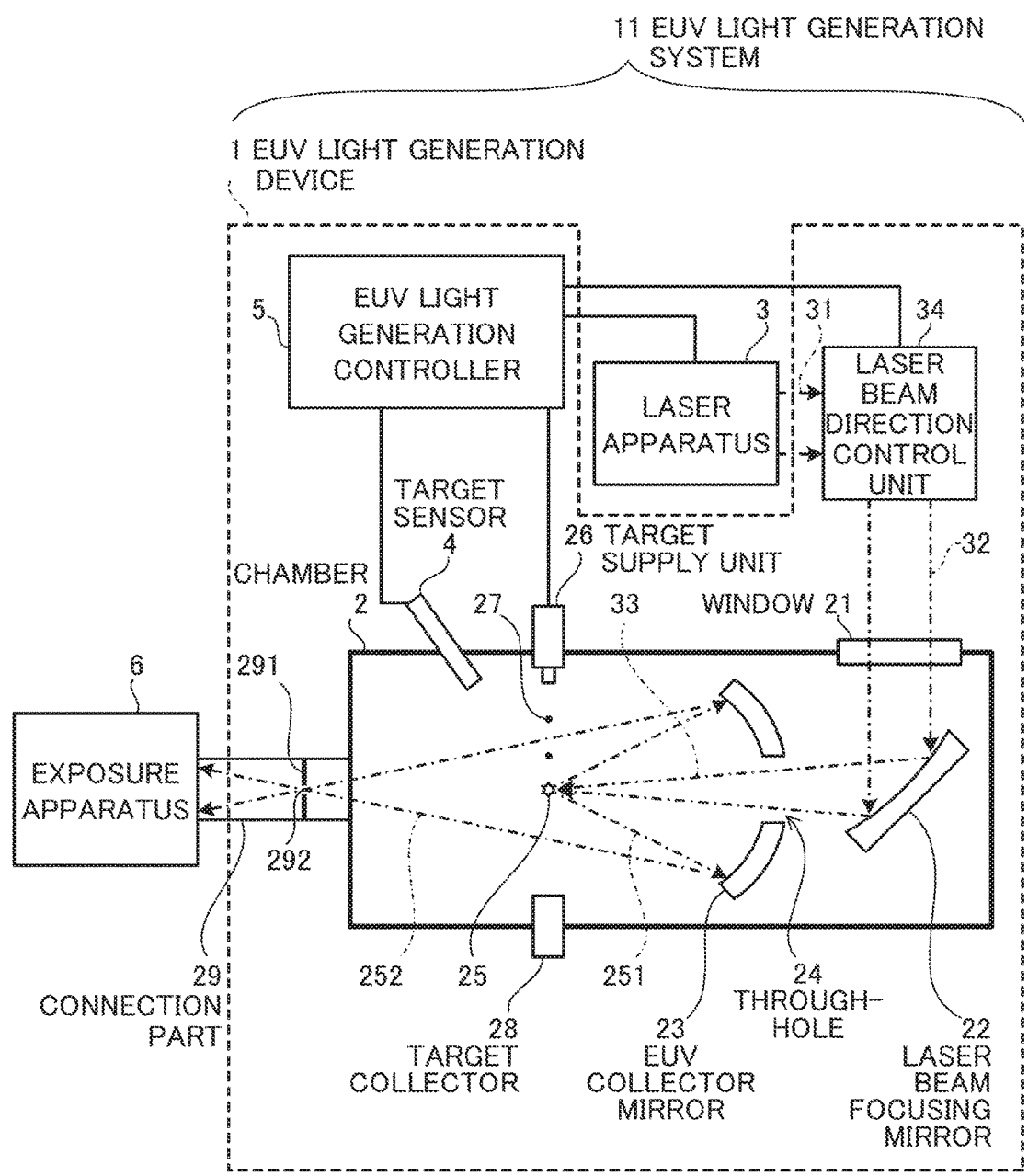
FIG. 1 schematically shows an exemplary configuration of an LPP type EUV light generating system.

1. Overall Description of Extreme Ultraviolet Light Generating System 1.1 Configuration FIG. 1 schematically shows an exemplary configuration of an LPP type EUV light generating system. An EUV light generating apparatus 1 may be used with at least one laser apparatus 3. In the present disclosure, a system that includes the EUV light generating apparatus 1 and the laser apparatus 3 may be referred to as an EUV light generating system 11. As shown in FIG. 1 and described in detail below, the EUV light generating apparatus 1 may include a chamber 2 and a target supply unit 26. The chamber 2 may be sealed airtight. The target supply unit 26 may be mounted on the chamber 2, for example, to penetrate a wall of the chamber 2. A target material to be supplied by the target supply unit 26 may include, but is not limited to, tin, terbium, gadolinium, lithium, or a combination of any two or more of them.

The chamber 2 may have at least one through-hole formed in its wall. A window 21 may be located at the through-hole. A pulse laser beam 32 outputted from the laser apparatus 3 may travel through the window 21. In the chamber 2, an EUV collector mirror 23 having a spheroidal reflective surface, for example, may be provided. The EUV collector mirror 23 may have a first focal point and a second focal point. The surface of the EUV collector mirror 23 may have, for example, a multi-layered reflective film in which molybdenum layers and silicon layers are alternately laminated. The EUV collector mirror 23 is preferably positioned such that the first focal point is positioned in a plasma generation region 25 and the second focal point is positioned in an intermediate focus (IF) region 292. The EUV collector mirror 23 may have a through-hole 24 formed at the center thereof, and a pulse laser beam 33 may travel through the through-hole 24.

The EUV light generating apparatus 1 may further include an EUV light generation controller 5 and a target sensor 4. The target sensor 4 may have a function of capturing an image and may detect the presence, actual path, position, speed, and the like of a target 27.

Furthermore, the EUV light generating apparatus 1 may include a connection part 29 for allowing the interior of the chamber 2 to be in communication with the interior of an exposure apparatus 6. In the connection part 29, a wall 291 with an aperture may be provided. The wall 291 may be positioned such that the second focal point of the EUV collector mirror 23 lies in the aperture formed in the wall 291.

Furthermore, the EUV light generating apparatus 1 may also include a laser beam direction control unit 34, a laser beam focusing mirror 22, a target collector 28 for collecting the target 27, and the like. The laser beam direction control unit 34 may include an optical system for defining the traveling direction of the pulse laser beam and an actuator for adjusting the position, the posture, or the like of the optical system.

1.2 Operation

With continued reference to FIG. 1, a pulse laser beam 31 outputted from the laser apparatus 3 may enter the laser beam direction control unit 34 and be outputted therefrom as the pulse laser beam 32. The pulse laser beam 32 may travel through the window 21 to enter the chamber 2. The pulse laser beam 32 may travel inside the chamber 2 along at least one laser optical path, be reflected by the laser beam focusing mirror 22, and be incident on the target 27 as the pulse laser beam 33.

The target supply unit 26 may be configured to output the target 27 toward the plasma generation region 25 in the chamber 2. The target 27 may be irradiated with at least one pulse of the pulse laser beam 33. By being irradiated with the pulse laser beam 33, the target 27 may be turned into plasma, and rays of light 251 may be emitted from the plasma. EUV light included in the light 251 may be reflected by the EUV collector mirror 23 at a higher reflectance than light in other wavelength regions. Reflected light 252 including the EUV light reflected by the EUV collector mirror 23 may be focused in the intermediate focus region 292 and outputted to the exposure apparatus 6.

The EUV light generation controller 5 may be configured to integrally control the EUV light generating system 11. The EUV light generation controller 5 may be configured to process, for example, image data of the target 27 captured by the target sensor 4. Further, the EUV light generation controller 5 may be configured to control the timing when the target 27 is outputted, the direction in which the target 27 is outputted, and the like. Furthermore, the EUV light generation controller 5 may, for example, be configured to control the timing when the laser apparatus 3 oscillates, the traveling direction in which the pulse laser beam 32 travels, the position at which the pulse laser beam 33 is focused, and the like. The various controls described above are merely examples, and other controls may be added as necessary.

2. Description of Terms

"A trajectory" of a target refers to an ideal path of the target outputted from a target supply unit, or a path of the target according to a design of the target supply unit.

"An actual path" of a target refers to an actual path of the target outputted from the target supply unit.

"A plasma generation region" refers to a region where a generation of plasma starts by irradiating the target with a pulse laser beam. The plasma generation region may correspond to a predetermined region in the present disclosure.

3. EUV Light Generating Apparatus According to Comparative Example

3.1 Configuration

Figure 2:
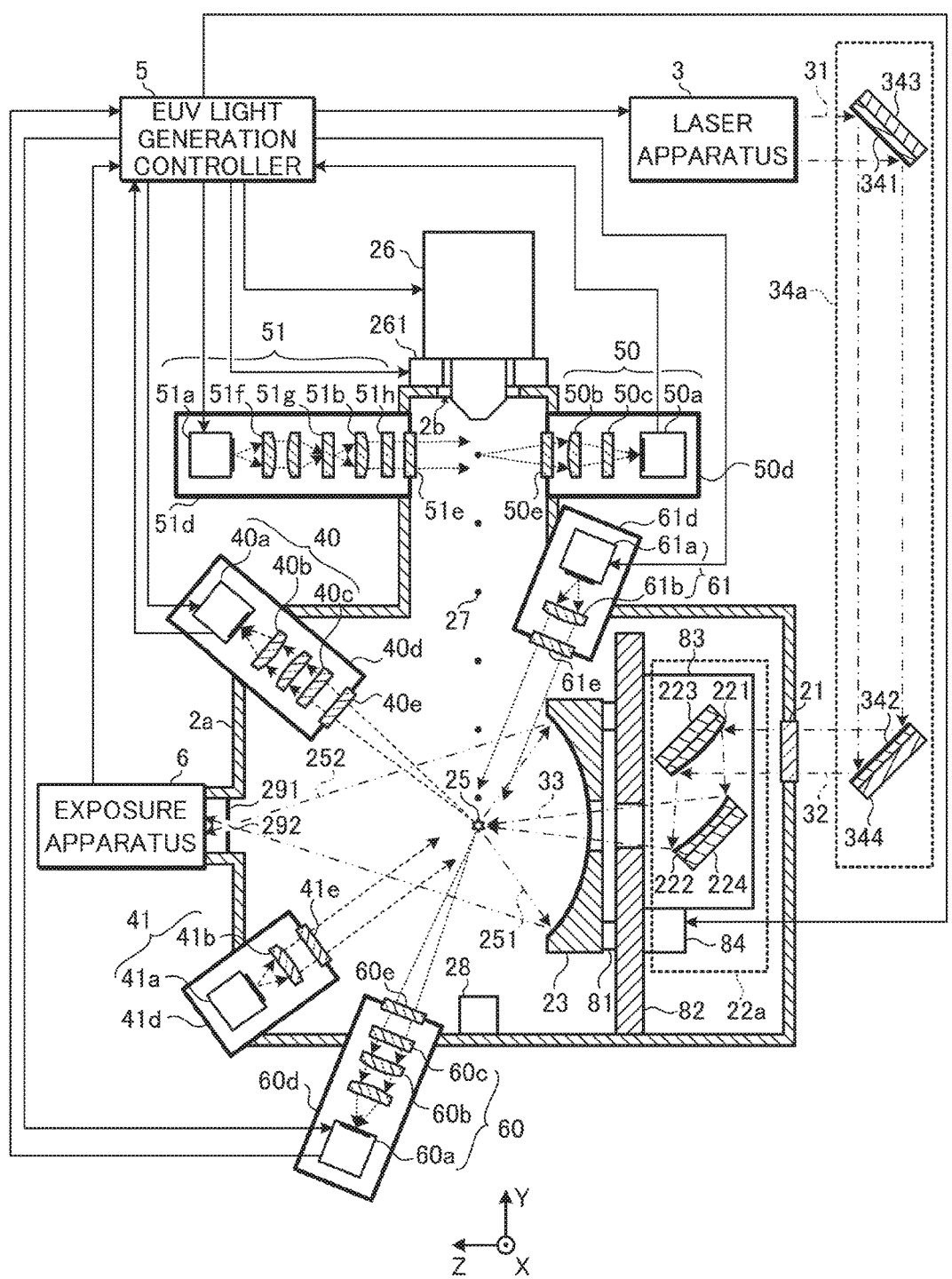
FIG. 2 schematically shows a configuration of an EUV light generating system according to a comparative example in the present disclosure.

FIG. 2 schematically shows a configuration of an EUV light generating system according to a comparative example of the present disclosure. As shown in FIG. 2, an output direction of EUV light may be a Z direction. A direction opposite to an output direction of the target may be a Y direction. The direction perpendicular to both the Z direction and the Y direction may be an X direction.

A target supply unit 26, a target position sensor 40, an illumination device 41, a target timing sensor 50, an illumination device 51, a target image capturing device 60, and an illumination device 61 may be attached to a chamber 2a.

3.1.1 Target Supply Unit

The target supply unit 26 may be provided so as to penetrate a through-hole 2b formed in a wall of the chamber 2a. The target supply unit 26 may be attached via an actuator 261 for the target supply unit 26 to the chamber 2a. The actuator 261 for the target supply unit 26 may be a biaxial stage to move the position of the target supply unit 26 relative to the chamber 2a in the Z direction along a Z-axis and the X direction along an X-axis. The actuator 261 for the target supply unit 26 may correspond to a second actuator in the present disclosure. An unillustrated sealer may be provided between the periphery of the through-hole 2b of the wall of the chamber 2a and the target supply unit 26 to seal the periphery of the through-hole 2b of the wall of the chamber 2a and the target supply unit 26. The sealer may be, for example, a Bellows tube.

The target supply unit 26 may store melted target material. The target material may be pressed with pressure of inert gas supplied to the target supply unit 26. The target supply unit 26 may have an unillustrated opening positioned in the chamber 2a. The target supply unit 26 may have an unillustrated vibrator in the vicinity of the opening described above.

3.1.2 Target Position Sensor

The target position sensor 40 and the illumination device 41 may each be directed to the plasma generation region 25. The target position sensor 40 may include an image sensor 40a, a transfer optical system 40b, and an optical filter 40c. The target position sensor 40 may further include an unillustrated image transferring optical system, an unillustrated high-speed shutter, and an unillustrated image data processing unit. The target position sensor 40 may be accommodated in a housing 40d, and the housing 40d may have a window 40e. The illumination device 41 may include a light source 41a and an illumination optical system 41b. The illumination device 41 may be accommodated in a housing 41d, and the housing 41d may have a window 41e. The light source 41a may be a CW (continuous wave) laser light source.

3.1.3 Target Timing Sensor

The target timing sensor 50 and the illumination device 51 may face each other with a trajectory of the target 27 being sandwiched between them. The target timing sensor 50 may include an optical sensor 50a, a light receiving optical system 50b, and an optical filter 50c. The target timing sensor 50 may be accommodated in a housing 50d, and the housing 50d may have a window 50e. The illumination device 51 may include a light source 51a, a conveying optical system 51f, an isolator 51g, an illumination optical system 51b, and an optical filter 51h. The illumination device 51 may be accommodated in a housing 51d, and the housing 51d may have a window 51e. The light source 51a may be a CW laser light source.

3.1.4 Target Image Capturing Device

The target image capturing device 60 and the illumination device 61 may face each other with the plasma generation region 25 being sandwiched between them. The target image capturing device 60 may include an image sensor 60a, a transfer optical system 60b, and an optical filter 60c. The target image capturing device 60 may further include an unillustrated image transferring optical system, an unillustrated high-speed shutter, and an unillustrated image data processing unit. The target image capturing device 60 may be accommodated in a housing 60d, and the housing 60d may have a window 60e. The illumination device 61 may include a light source 61a and an illumination optical system 61b. The illumination device 61 may be accommodated in a housing 61d, and the housing 61d may have a window 61e. The light source 61a may be a pulse laser light source.

3.1.5 Laser Beam Direction Control Unit and the Like

A laser beam direction control unit 34a provided outside the chamber 2a may include high-reflective mirrors 341 and 342. The high-reflective mirror 341 may be held by a holder 343. The high-reflective mirror 342 may be held by a holder 344.

The chamber 2 may accommodate a laser beam focusing optical system 22a, EUV collector mirror holders 81, plates 82 and 83, and an actuator 84 for the laser beam focusing optical system 22a.

The plate 82 may be fixed to the chamber 2. The plate 82 may hold a plate 83 via the actuator 84 for the laser beam focusing optical system 22a. The laser beam focusing optical system 22a may include an off-axis paraboloidal convex mirror 221 and an ellipsoid concave mirror 222. The off-axis paraboloidal convex mirror 221 may be held by a holder 223. The ellipsoid concave mirror 222 may be held by a holder 224. The holders 223 and 224 may be anchored to the plate 83. The actuator 84 for the laser beam focusing optical system 22a may be capable of moving the position of the plate 83 relative to the plate 82 according to a control signal outputted from the EUV light generation controller 5.

The off-axis paraboloidal convex mirror 221 may have a convex surface of a paraboloid of revolution as a reflective surface. The off-axis paraboloidal convex mirror 221 may be arranged such that an axis of the paraboloid of revolution is substantially parallel to an optical axis of the pulse laser beam 32.

The ellipsoid concave mirror 222 may have a spheroidal concave surface as a reflective surface. The ellipsoid concave mirror 222 may have a first focal point and a second focal point. The ellipsoid concave mirror 222 may be arranged such that the first focal point of the ellipsoid concave mirror 222 substantially coincides with the focal point of the off-axis paraboloidal convex mirror 221. The second focal point of the ellipsoid concave mirror 222 may be positioned in the plasma generation region 25.

The EUV collector mirror 23 may be fixed to the plate 82 via the EUV collector mirror holders 81.

3.2 Operation

3.2.1 Outputting Target

In the target supply unit 26 described above, the target material pressed with the pressure of the inert gas may be outputted through the opening described above. The vibrator described above may vibrate the target supply unit 26 to separate the outputted target material into a plurality of droplets. Each of the droplets may move as the target 27 along the trajectory from the target supply unit 26 to the plasma generation region 25.

The pressure of the inert gas supplied to the target supply unit 26 may be controlled by a control signal from the EUV light generation controller 5. Controlling the pressure of the inert gas may enable the moving speed of the target 27 to be controlled.

3.2.2 Detecting Target Passage Timing

The illumination device 51 may output a CW laser beam toward the trajectory of the target 27 and its periphery. One target 27 may pass through the optical path of the light outputted from the illumination device 51. At this time, a part of the light may be blocked by the target 27, which may cause the intensity of the light reaching the target timing sensor 50 to be temporarily low. The target timing sensor 50 may detect the change in the intensity of the light and may output a target passage timing signal to the EUV light generation controller 5.

The EUV light generation controller 5 may transfer the target passage timing signal to the laser apparatus 3. The laser apparatus 3 may perform laser oscillation at a predetermined delay time from receiving the target passage timing signal and may output the pulse laser beam. The predetermined delay time may be set such that the pulse laser beam is focused at the plasma generation region 25 at the timing when the target 27 reaches the plasma generation region 25.

3.2.3 Calculating Information on Position of Target

The illumination device 41 may output the CW laser beam toward the plasma generation region 25 and its periphery. When the target 27 reaches the optical path of the light outputted from the illumination device 41, the light may be incident on the target 27.

At this time, an image of the target 27 may be formed on a photosensitive surface of the image sensor 40*a* included in the target position sensor 40. The image sensor 40*a* may output image data of the target 27. The target position sensor 40 may calculate, with an unillustrated image data processing unit, information on the position of the target 27 based on the image data described above. If the direction of the target position sensor 40 facing the plasma generation region 25 is substantially parallel to the YZ plane as shown in FIG. 2, information on the position of the target 27 at least in the X direction may be calculated.

Further, if the first embodiment includes a target position sensor 42 directed substantially parallel to the XY plane, as described below with reference to FIG. 10, information on the position of the target 27 in the Z direction may be calculated.

The target position sensors 40 and 42 may each include an unillustrated high-speed shutter. The high-speed shutter may be controlled by the EUV light generation controller 5 to open and close at a predetermined delay time from the target passage timing signal outputted from the target timing sensor 50. By combining the information on the positions outputted from the target position sensors 40 and 42 each capturing the image of the target 27 at the predetermined timing, information on the position of the target 27 in the X direction, the Y direction, and the Z direction may be calculated. The predetermined delay time for the high-speed shutter to open and close may be shorter than the predetermined delay time for the laser apparatus 3 to output the pulse laser beam. The image of the target 27 may thus be captured before the laser apparatus 3 outputs the pulse laser beam.

At least one of the target position sensors 40 and 42 may send the information on the position of the target to the EUV light generation controller 5. The EUV light generation controller 5 may compare the information on the position of the target and a preset targeted position for the target. The EUV light generation controller 5 may then control the actuator 261 for the target supply unit 26 to compensate for the difference between the position of the target and the targeted position. Controlling the actuator 261 for the target supply unit 26 to move the target supply unit 26 in the X direction or the Z direction may enable the position of the trajectory of the target in the X direction or the e direction to be adjusted.

If the target position sensors 40 and 42 calculate the information on the position of the target 27 in the Y direction, the EUV light generation controller 5 may control the laser apparatus 3 such that the pulse laser beam is incident on the target 27 at the plasma generation region 25. Namely, the EUV light generation controller 5 may change the predetermined delay time, which is set for the laser apparatus 3, to adjust the position of the target 27 in the Y direction at the time the pulse laser beam is incident on the target 27. The EUV light generation controller 5 may further control the actuator 84 for the laser beam focusing optical system 22*a* such that the pulse laser beam is incident on the target 27 at the plasma generation region 25.

3.2.4 Capturing Image of Target

The illumination device 61 may output the pulse laser beam toward the plasma generation region 25 and its periphery. The pulse laser beam from the illumination device 61 may be controlled by the EUV light generation controller 5 to be outputted at a predetermined delay time from the target passage timing signal outputted by the target timing sensor 50. At the time when at least one target 27 reaches the optical path of the pulse laser beam outputted from the illumination device 61, the pulse laser beam may be incident on the target 27.

At this time, an image of a silhouette of the target 27 may be formed on a photosensitive surface of the image sensor 60*a* included in the target image capturing device 60. The image sensor 60*a* may output image data of the silhouette of the target 27. The target image capturing device 60 may calculate, with an unillustrated image data processing unit, position, dimension, moving direction, moving speed, etc. of the target based on the image data described above. The target image capturing device 60 may send the data on the position, the dimension, the moving direction, the moving speed, etc. of the target to the EUV light generation controller 5.

The EUV light generation controller 5 may control the laser apparatus 3, the target supply unit 26, and the like based on the data on the position, the dimension, the moving direction, the moving speed, etc. of the target. For example, if the laser apparatus 3 outputs a pre-pulse laser beam and a main pulse laser beam, a delay time of the main pulse laser beam relative to the pre-pulse laser beam may be controlled. The pre-pulse laser beam may diffuse a droplet target 27. The main pulse laser beam may be incident on the diffused target to generate plasma. In that case, the target image capturing device 60 may capture an image of the diffused target or the plasma, as a form of the target 27. The EUV light generation controller 5 may control, based on the data on the position, the dimension, diffusing direction, diffusing speed of the diffused target or the plasma, the delay time for the pre-pulse laser beam, the delay time for the main pulse laser beam, the target supply unit 26, the actuator 84 for the laser beam focusing optical system 22*a*, etc. The EUV light generation controller 5 may also control the pressure of the inert gas supplied to the target supply unit 26 based on the data on the moving speed of the target 27 such that the moving speed of the target 27 approaches a targeted value.

3.2.5 Generating Plasma

The pulse laser beam 31 outputted from the laser apparatus 3 may be reflected by the high-reflective mirrors 341 and 342 included in the laser beam direction control unit 34a to enter the laser beam focusing optical system 22a as the pulse laser beam 32.

The pulse laser beam 32 may be expanded by being reflected by the off-axis paraboloidal convex mirror 221 included in the laser beam focusing optical system 22a, and then be reflected by the ellipsoid concave mirror 222 to be focused at the plasma generation region 25 as the pulse laser beam 33.

At the plasma generation region 25 or its vicinity, one target 27 may be irradiated with the pulse laser beam 33. By being irradiated with the pulse laser beam 33, the target 27 may be turned into plasma and the EUV light may be generated.

3.2.6 Moving Plasma Generation Region

Figure 3:
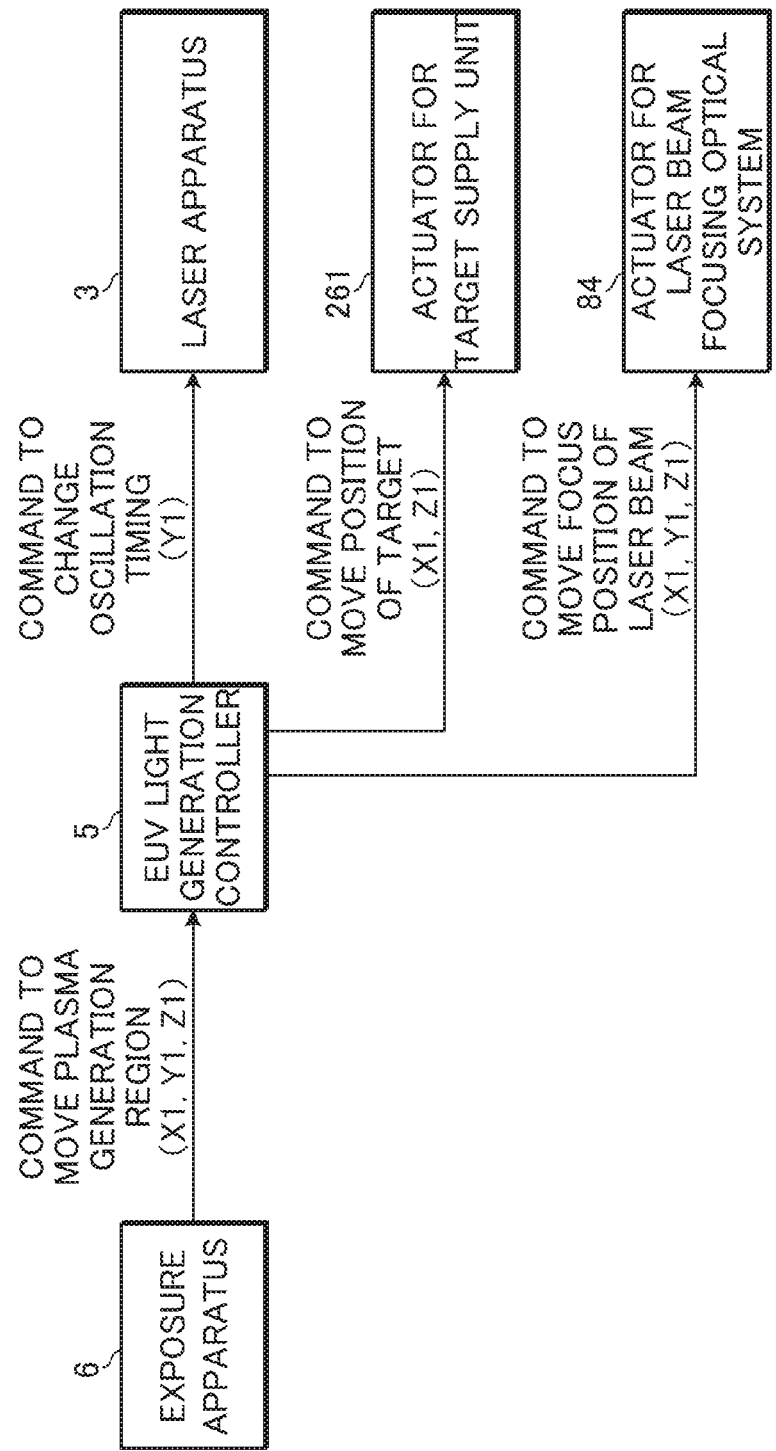
FIG. 3 shows a control system to move a plasma generation region in the comparative example described above.

FIG. 3 shows a control system to move the plasma generation region in the comparative example described above. The EUV light generation controller 5 may receive a command signal to move the plasma generation region 25 from the exposure apparatus 6. The command signal to move the plasma generation region 25 may include information on an amount of moving the plasma generation region 25 in the X direction, the Y direction, and the e direction. Alternatively, the command signal to move the plasma generation region 25 may include information on targeted coordinates of the plasma generation region 25. As an example, the following description is made in the case where the plasma generation region 25 is moved to a coordinate position (X1, Y1, Z1).

The EUV light generation controller 5 may move, upon receiving the command signal to move the plasma generation region 25, the position of the target and the focus position of the laser beam as follows.

The EUV light generation controller 5 may control the laser apparatus 3 to move the position of the target 27 in the Y direction at a predetermined timing to Y1. Namely, the EUV light generation controller 5 may send a command to change the oscillation timing to the laser apparatus 3 so as to control the predetermined delay time for the laser apparatus 3 to output the pulse laser beam.

The EUV light generation controller 5 may control the actuator 261 for the target supply unit 26 to move the position of the target in the X direction and the Z direction to the coordinate position (X1, Z1). Namely, the EUV light generation controller 5 may send a command to move the position of the target to the actuator 261 for the target supply unit 26 to move the target supply unit 26.

The EUV light generation controller 5 may control the actuator 84 for the laser beam focusing optical system 22a so as to adjust the focus position of the laser beam to the coordinate position (X1, Y1, Z1). Namely, the EUV light generation controller 5 may send a command to move the focus position of the laser beam to the actuator 84 for the laser beam focusing optical system 22a so as to move the position of the plate 83 relative to the plate 82. Moving the position of the plate 83 may result in moving the position of the off-axis paraboloidal convex mirror 221 and the position of the ellipsoid concave mirror 222. The focus position of the pulse laser beam 33 reflected by the off-axis paraboloidal convex mirror 221 and the ellipsoid concave mirror 222 may thus be moved.

3.3 Problem

Figure 4:
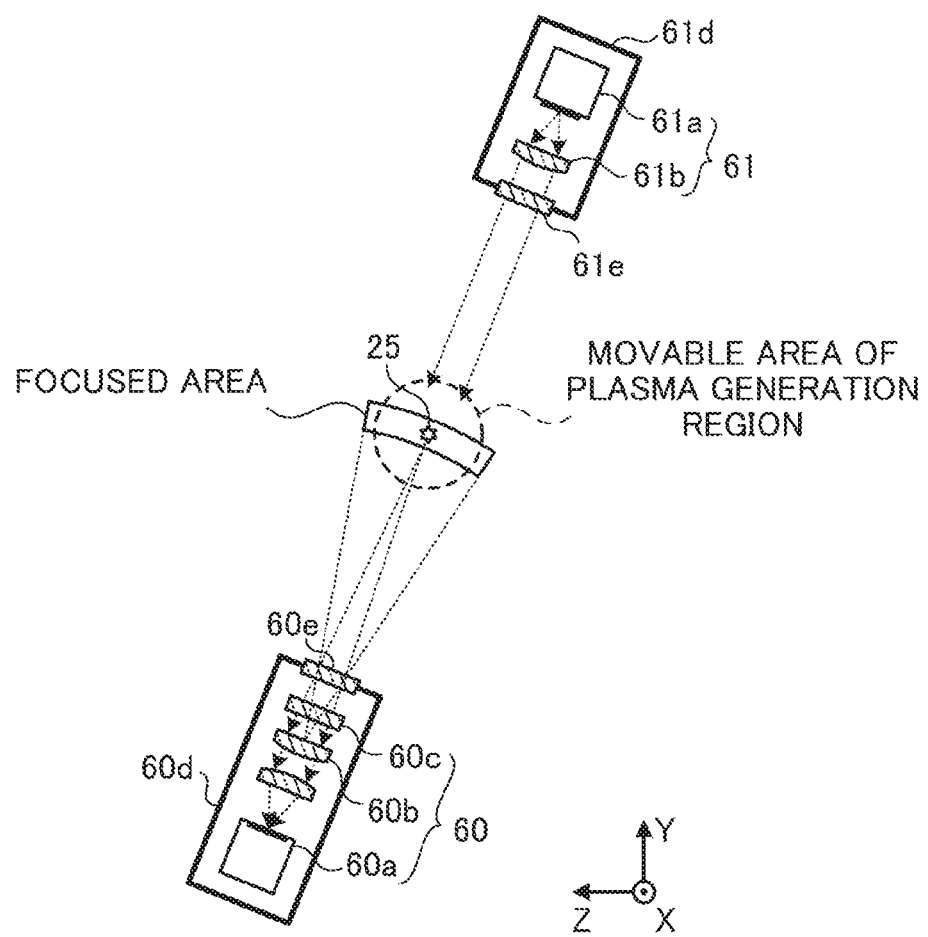
FIG. 4 explains a problem in the comparative example described above.

FIG. 4 explains a problem in the comparative example described above. FIG. 4 shows the target image capturing device 60 and the illumination device 61 extracted from FIG. 2. In the target image capturing device 60, an image of an object in a predetermined focused area may be captured by being formed on the image sensor 60a. The predetermined focused area may be positioned at a predetermined distance from the transfer optical system 60b. However, a sharp image of an object at a position different from the focused area may fail to be formed on the image sensor 60a. An unsharp image having low contrast may only be formed. The focused area, in which objects appear sharp in an image in the target image capturing device 60, may have a tolerance to some extent. The focused area is labeled "FOCUSED AREA" in FIG. 4.

In the target image capturing device 60, the transfer optical system 60b may preferably have a large numerical aperture (NA) to achieve high spatial resolution. However, the larger the numerical aperture is, the narrower the focused area is. Specifically, a large numerical aperture may result in a small depth of field of the target image capturing device 60.

As described with reference to FIG. 3, the plasma generation region 25 may move according to the command from the exposure apparatus 6. As shown in FIG. 4, the focused area may be smaller than a movable area of the plasma generation region 25. If the plasma generation region 25 moves out of the focused area, the target image capturing device 60 may fail to capture a sharp image of the target.

If a sharp image of the target 27 is not captured, detection of the position, the dimension, the moving direction, the moving speed, etc. of the target may be inaccurate. Control of the laser apparatus 3, the target supply unit 26 and the like described above may thus be unstable, and generation of the EUV light may be unstable.

Even if the plasma generation region 25 does not move, a target 27 shifted far from the plasma generation region 25 may not appear sharp in an image to be captured.

In the embodiments described below, the target image capturing device 60 may be capable of moving the focused area to capture a sharp image of the target 27 and to stabilize generation of the EUV light.

4. Target Image Capturing Device Capable of Moving Focused Area

4.1 Configuration and Operation

Figure 5:
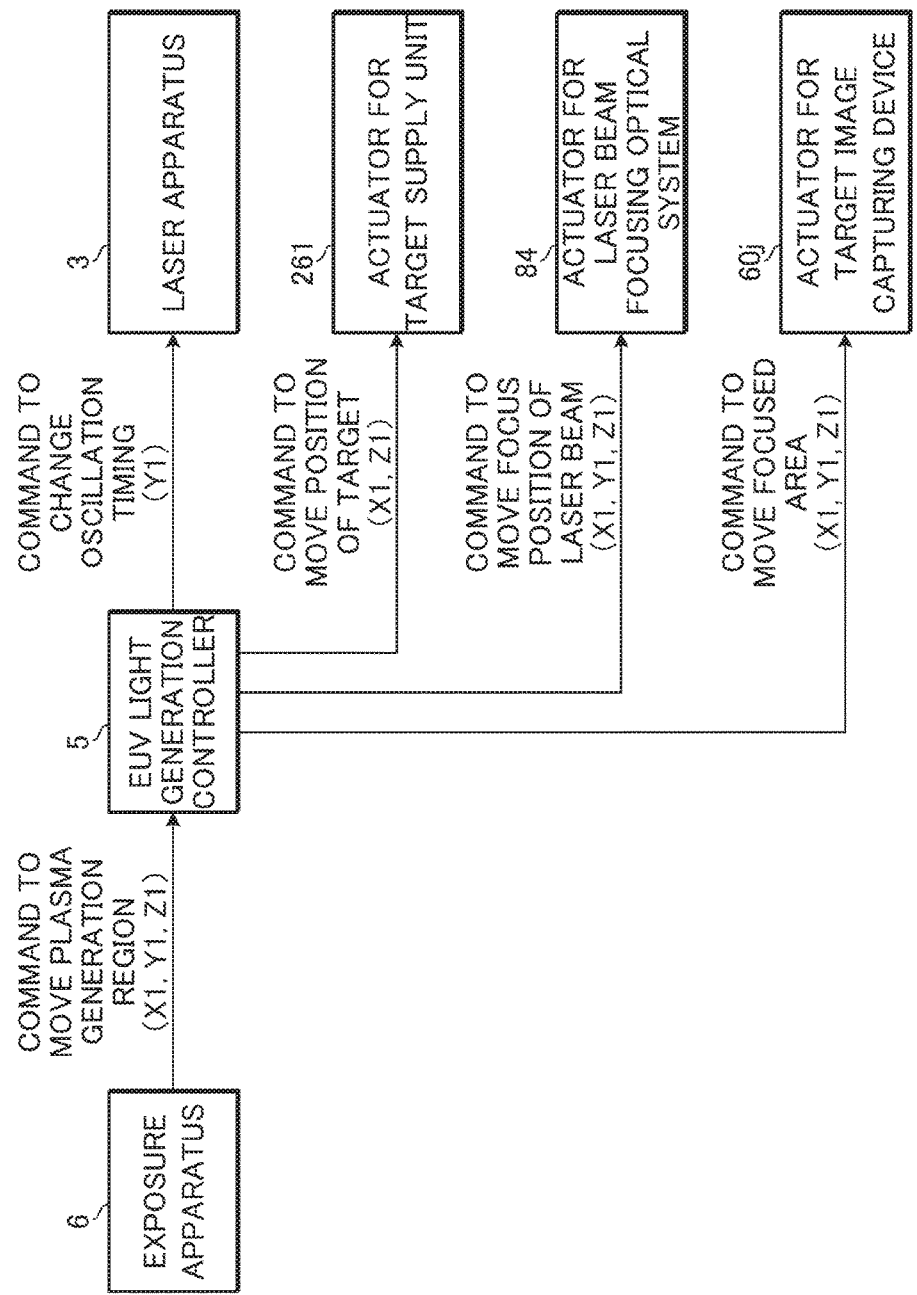
FIG. 5 shows a control system of an EUV light generating apparatus according to a first embodiment of the present disclosure.

FIG. 5 shows a control system of an EUV light generating apparatus according to a first embodiment of the present disclosure. If an EUV light generation controller 5 in the first embodiment receives the command signal to move the plasma generation region 25 from the exposure apparatus 6, the focused area to capture an image of the target may be moved.

FIGS. 6A and 6B show a target image capturing device 60, an illumination device 61, and a target supply unit 26, included in the EUV light generating apparatus according to the first embodiment of the present disclosure. The target image capturing device 60 of the first embodiment may further include a plate 60i and an actuator 60j for the target image capturing device 60. In other aspects, the first embodiment may have substantially the same configuration as that described with reference to FIG. 2.

The plate 60i and the actuator 60j for the target image capturing device 60 may be provided in the housing 60d. The plate 60i may hold the image sensor 60a and the transfer optical system 60b. The actuator 60j for the target image capturing device 60 may be capable of moving the plate 60i, the image sensor 60a, and the transfer optical system 60b, relative to the housing 60d.

Moving the plate 60i by the actuator 60j for the target image capturing device 60 along the capturing direction of the target image capturing device 60 may cause the focused area to be moved. The distance of moving the focused area may be substantially the same as the distance of moving the plate 60i. The actuator 60j for the target image capturing device 60 may correspond to a first actuator in the present disclosure.

With reference to FIG. 5 again, the EUV light generation controller 5 may control the actuator 60j for the target image capturing device 60 to move the focused area, upon receiving the command signal to move the plasma generation region 25 from the exposure apparatus 6. Namely, the EUV light generation controller 5 may send a command to move the focused area to the actuator 60j for the target image capturing device 60 such that the position of the coordinate position (X1, Y1, Z1) of the plasma generation region 25 is included in the focused area. The distance of moving the focused area may be calculated based on the command to move the plasma generation region 25 received from the exposure apparatus 6.

In other aspects, the control system in the first embodiment may be substantially the same as that described with reference to FIG. 3. For example, the EUV light generation controller 5 may move the target supply unit 26 based on the command signal to move the plasma generation region 25 received from the exposure apparatus 6. Further, the EUV light generation controller 5 may move the laser beam focusing optical system 22a to move the focus point of the pulse laser beam 33.

4.2 Method to Calculate Distance of Moving

Figure 7:
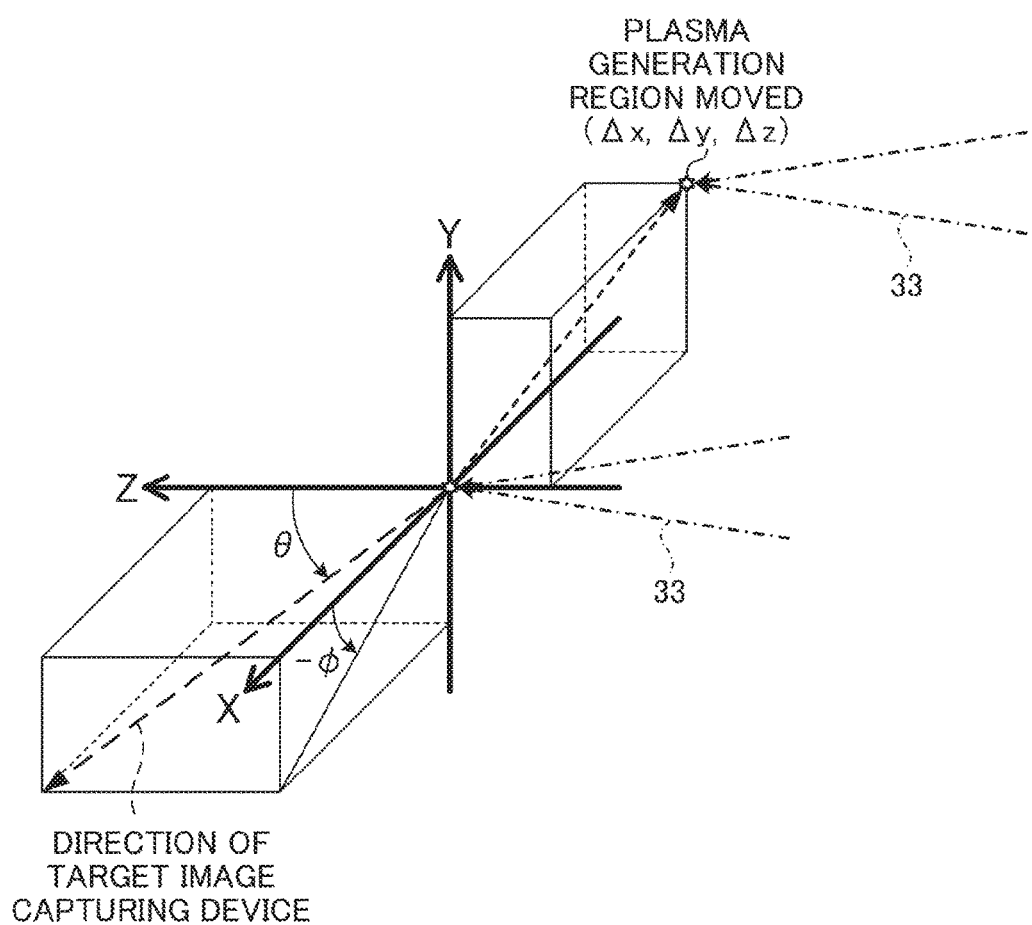
FIG. 7 explains an example of a method to calculate distance of moving a focused area.

FIG. 7 explains an example of a method to calculate the distance of moving the focused area. FIG. 7 may assume that the plasma generation region 25 before moving is at the intersection of X, Y, and Z-axes. As shown in FIG. 7, the capturing direction of the target image capturing device 60 may be inclined at an angle θ relative to the Z-axis. Further, when the line representing the capturing direction of the target image capturing device 60 is projected on the XY plane, the projected image may be inclined at an angle −φ relative to the X-axis.

If the plasma generation region 25 moves from the present position by (Δx, Δy, Δz) to the position of coordinates (X1, Y1, Z1), the distance L to move the target image capturing device 60 along the capturing direction of the target image capturing device 60 may be calculated as follows.

$$L = (\sin\theta\cos\phi \;\; \sin\theta\sin\phi \;\; \cos\theta) \begin{pmatrix} \Delta x \\ \Delta y \\ \Delta z \end{pmatrix}$$

$$= \Delta x \sin\theta\cos\phi + \Delta y \sin\theta\sin\phi + \Delta z \cos\theta$$

4.3 Effect

According to the first embodiment, moving the focused area focused by the target image capturing device 60 may enable the target image capturing device 60 to capture a sharp image of the target 27 that reaches the plasma generation region 25 or its vicinity. Further, even if the plasma generation region 25 moves, the magnification of the captured image may be kept substantially constant. Further, moving the target image capturing device 60 may achieve rapid control, compared to performing autofocus based on images captured by the target image capturing device 60.

5. Control Based on Output from Target Position Sensor

Figure 8:
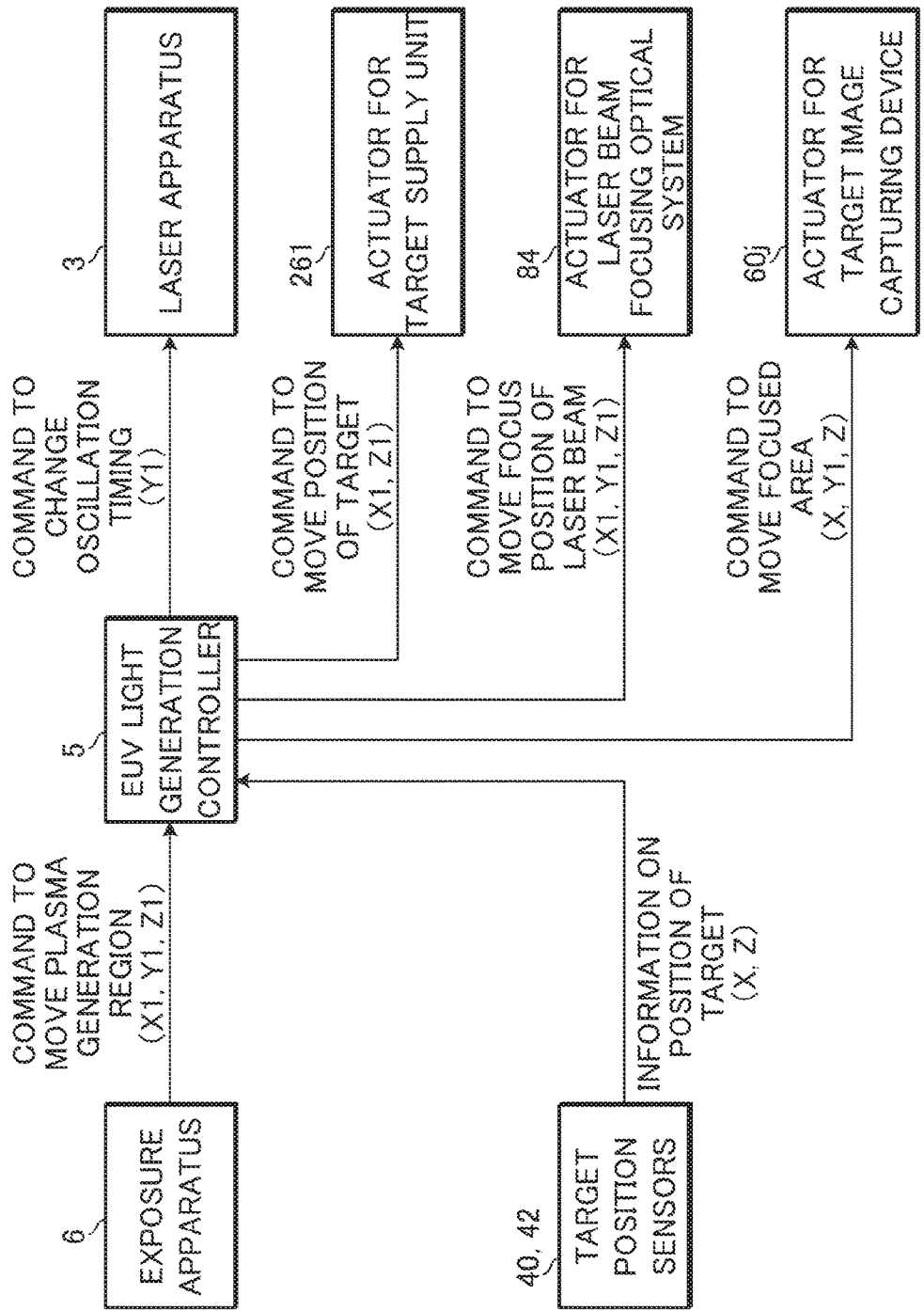
FIG. 8 shows a control system of an EUV light generating apparatus according to a second embodiment of the present disclosure.

FIG. 8 shows a control system of an EUV light generating apparatus according to a second embodiment of the present disclosure. In the second embodiment, the focused area may be moved based on information on the position of the target outputted from the target position sensor.

Figure 9:
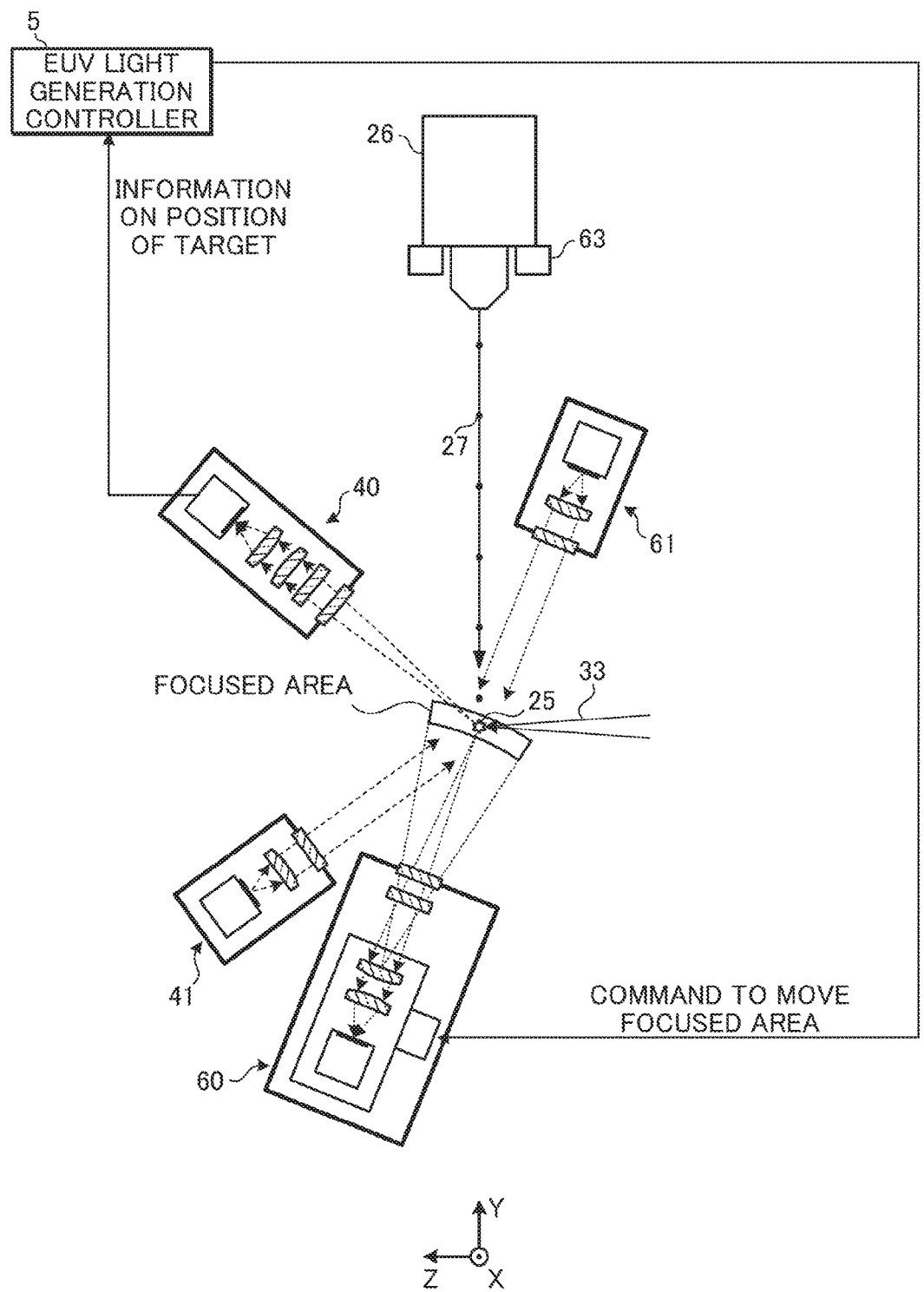
FIG. 9 shows a target image capturing device, a target position sensor, two illumination devices, and a target supply unit, included in the EUV light generating apparatus according to the second embodiment of the present disclosure.

FIG. 9 shows a target image capturing device 60, an illumination device 61, a target position sensor 40, another illumination device 41, and a target supply unit 26, included in the EUV light generating apparatus according to the second embodiment of the present disclosure. FIG. 9 is a view of these elements along the X-axis.

Figure 10:
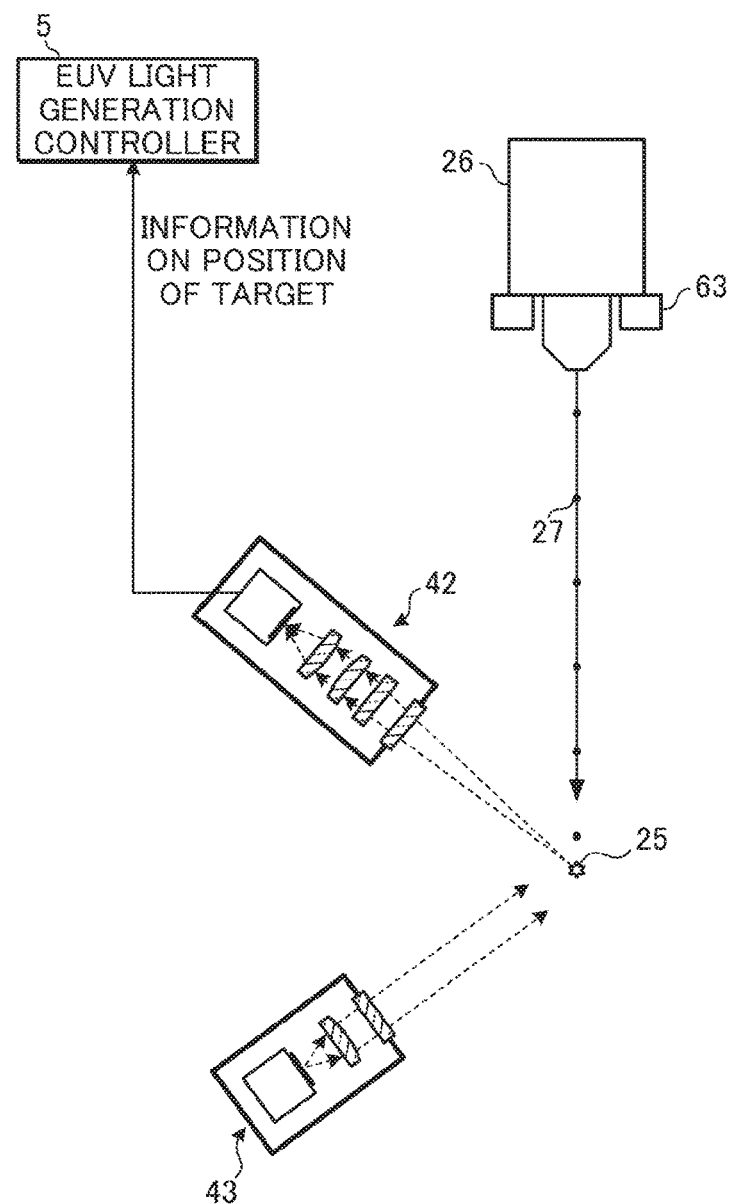
FIG. 10 shows another target position sensor, another illumination device, and the target supply unit, included in the EUV light generating apparatus according to the second embodiment of the present disclosure.

FIG. 10 shows another target position sensor 42, another illumination device 43, and the target supply unit 26, included in the EUV light generating apparatus according to the second embodiment of the present disclosure. FIG. 10 is a view along the Z-axis to show some elements that are not shown in FIG. 2.

The target position sensor 40 shown in FIG. 9 may be capable of calculating information on the position of the target 27 in the X direction. In contrast, the target position sensor 42 shown in FIG. 10 may be capable of calculating information on the position of the target 27 in the e direction.

With reference to FIG. 8 again, the command to move the focused area outputted from the EUV light generation controller 5 to the actuator 60j for the target image capturing device 60 may be generated based on the position (X, Z) of the target 27 in the X direction and the Z direction received from the target position sensors 40 and 42. Namely, the information on the position (X1, Z1) in the X direction and the E direction included in the command to move the plasma generation region 25 received from the exposure apparatus 6 may not necessarily be used to control the actuator 60j for the target image capturing device 60. The information on the position (Y1) in the Y direction included in the command to move the plasma generation region 25 received from the exposure apparatus 6 may be used. If one of the target position sensors 40 and 42 is not used, information included in the command to move the plasma generation region 25 received from the exposure apparatus 6 may be used for the position in one of the X direction and the Z direction.

In other aspects, the second embodiment may be substantially the same as the first embodiment.

According to the second embodiment, even if an actual path of the target 27 shifts from the plasma generation region 25, a sharp image of the target 27 may be captured by moving the focused area focused by the target image capturing device 60.

If the target 27 shifts from the plasma generation region 25, the actuator 261 for the target supply unit 26 and the laser apparatus 3 may be controlled such that the position of the target 27 approaches the targeted position as described above. The position of the target 27 may thus be expected to approach the plasma generation region 25.

6. Control Based on Output from Target Position Sensor and Target Timing Sensor

Figure 11:
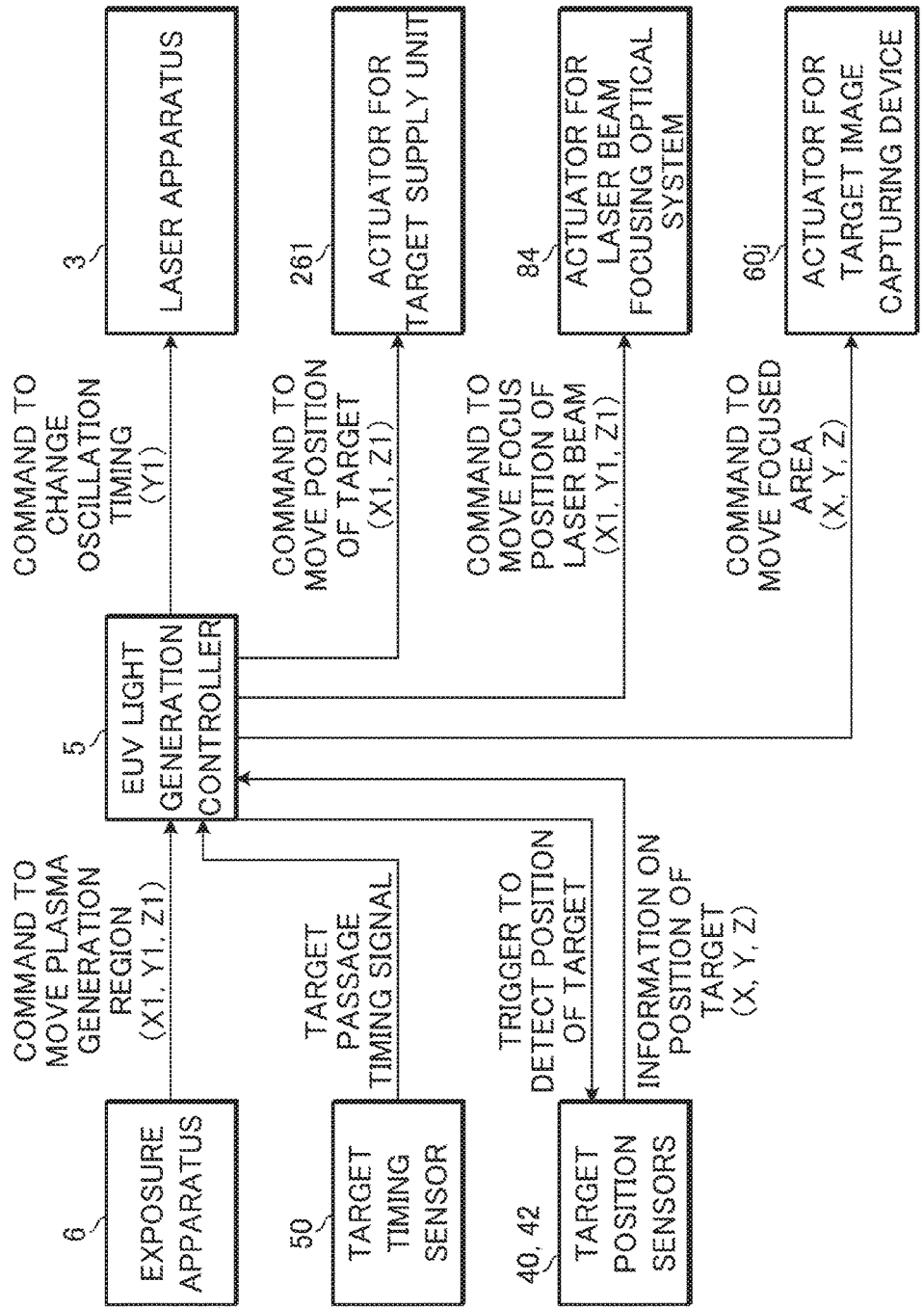
FIG. 11 shows a control system of an EUV light generating apparatus according to a third embodiment of the present disclosure.

FIG. 11 shows a control system of an EUV light generating apparatus according to a third embodiment of the present disclosure. In the third embodiment, the target position sensors 40 and 42 may be controlled using the target passage timing signal outputted from the target timing sensor 50 and may detect information on the position (Y) of the target in the Y direction. The focused area may be moved based on the information on the position (Y) of the target in the Y direction.

FIG. 12 shows a target image capturing device 60, an illumination device 61, a target position sensor 40, another illumination device 41, a target timing sensor 50, another illumination device 51, and a target supply unit 26, included in the EUV light generating apparatus according to the third embodiment of the present disclosure. FIG. 12 is a view of these elements along the X-axis.

In the third embodiment, similarly to the second embodiment, information on the position of the target in the X direction outputted from the target position sensor 42 may also be used.

The target position sensor 40 may include a high-speed shutter 40k. The high-speed shutter 40k may be controlled by the EUV light generation controller 5 to open and close at a predetermined delay time from the target passage timing signal outputted from the target timing sensor 50. Similarly, the target position sensor 42 may also include a high-speed shutter. Combining the information on the position of the target outputted from the target position sensors 40 and 42 may enable the EUV light generation controller 5 to calculate information on the position of the target 27 in the X direction, the Y direction, and the e direction.

With reference to FIG. 11 again, the command to move the focused area outputted from the EUV light generation controller 5 to the actuator 60j for the target image capturing device 60 may be generated based on the information on the position (X, Y, Z) of the target 27 in the X direction, the Y direction, and the e direction based on the information outputted from the target position sensors 40 and 42. Namely, the information on the position (X1, Y1, Z1) in the X direction, the Y direction, and the Z direction included in the command to move the plasma generation region 25 received from the exposure apparatus 6 may not necessarily be used to control the actuator 60j for the target image capturing device 60.

In other aspects, the third embodiment may be substantially the same as the second embodiment.

7. Target Position Sensor Using Pulsed Illumination

Figure 13:
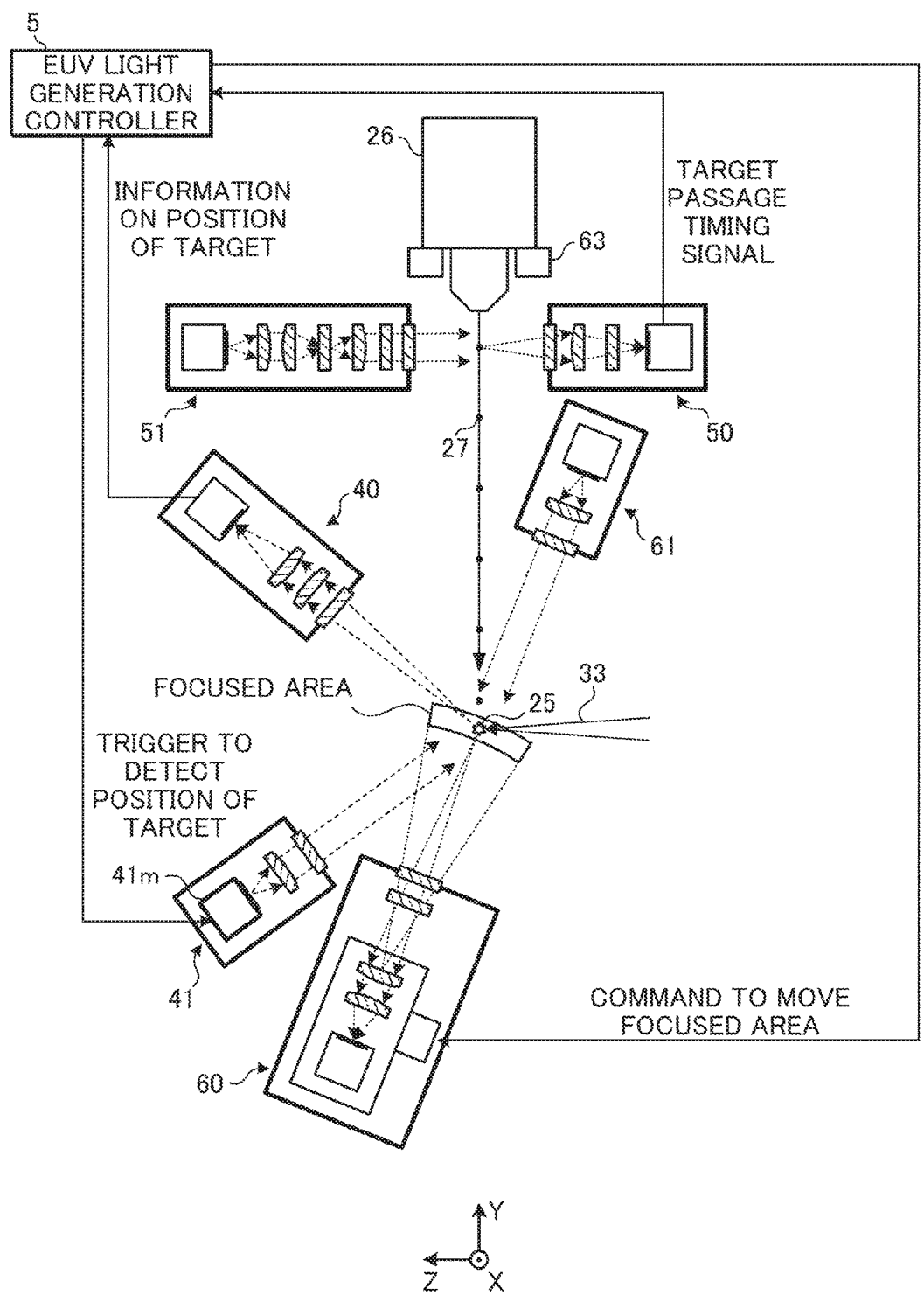
FIG. 13 shows a target image capturing device, a target position sensor, a target timing sensor, three illumination devices, and a target supply unit, included in an EUV light generating apparatus according to a fourth embodiment of the present disclosure.

FIG. 13 shows a target image capturing device 60, an illumination device 61, a target position sensor 40, another illumination device 41, a target timing sensor 50, another illumination device 51, and a target supply unit 26, included in an EUV light generating apparatus according to a fourth embodiment of the present disclosure. FIG. 13 is a view of these elements along the X-axis.

In the fourth embodiment, similarly to the second and third embodiments, information on the position of the target in the X direction outputted from the target position sensor 42 may also be used.

The target position sensor 40 may not necessarily include the high-speed shutter 40k (see FIG. 12). In the fourth embodiment, the illumination device 41 may include a pulse laser or a flash lamp 41m as the light source. The pulse laser or the flash lamp 41m may be controlled by the EUV light generation controller 5 to perform pulsed oscillation or flash emission at a predetermined delay time from the target passage timing signal outputted from the target timing sensor 50. The target position sensor 42 and the illumination device 43 may be similar to the target position sensor 40 and the illumination device 41. Combining the information on the position of the target outputted from the target position sensors 40 and 42 may enable the EUV light generation controller 5 to calculate information on the position of the target 27 in the X direction, the Y direction, and the Z direction.

In other aspects, the fourth embodiment may be substantially the same as the third embodiment.

8. Target Image Capturing Device Including High-Speed Shutter

Figure 14A:
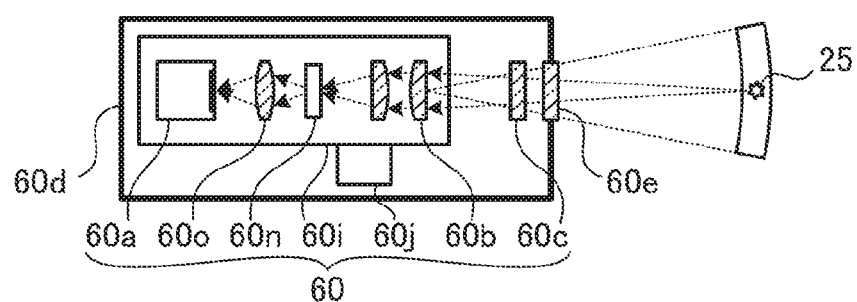
FIGS. 14A and 14B show a target image capturing device of an EUV light generating apparatus according to a fifth embodiment of the present disclosure.
Figure 14B:
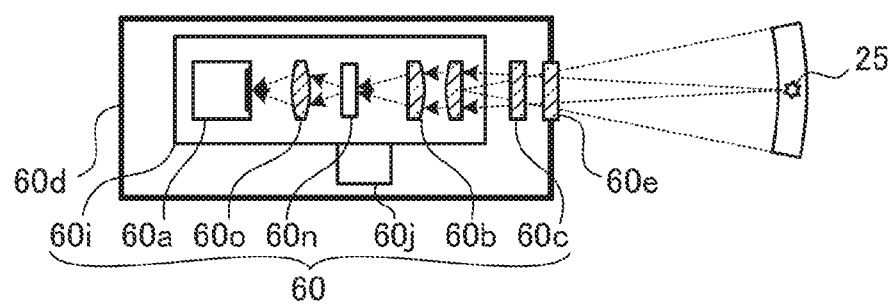

FIGS. 14A and 14B show a target image capturing device 60 of an EUV light generating apparatus according to a fifth embodiment of the present disclosure. In the fifth embodiment, the target image capturing device 60 may include a high-speed shutter 60n and an image transferring optical system 60o. These elements may be held by a plate 60i.

The high-speed shutter 60n may be provided between the transfer optical system 60b and the image sensor 60a. The high-speed shutter 60n may be provided at a position of an image formed by the transfer optical system 60b. The image transferring optical system 60o may be provided between the high-speed shutter 60n and the image sensor 60a. The image transferring optical system 60o may be provided so as to transfer the image formed at the high-speed shutter 60n to a light receiving surface of the image sensor 60a.

The high-speed shutter 60n may be controlled to open and close by the EUV light generation controller 5. An image of an object in the focused area may be formed on the image sensor 60a only when the high-speed shutter 60n is open.

Moving the plate 60i by the actuator 60j for the target image capturing device 60 may cause the image sensor 60a, the transfer optical system 60b, the high-speed shutter 60n, and the image transferring optical system 60o to integrally move.

In other aspects, the fifth embodiment may be substantially the same as the first to fourth embodiments.

9. Target Image Capturing Device Including Image Conveying Fiber

Figure 15A:
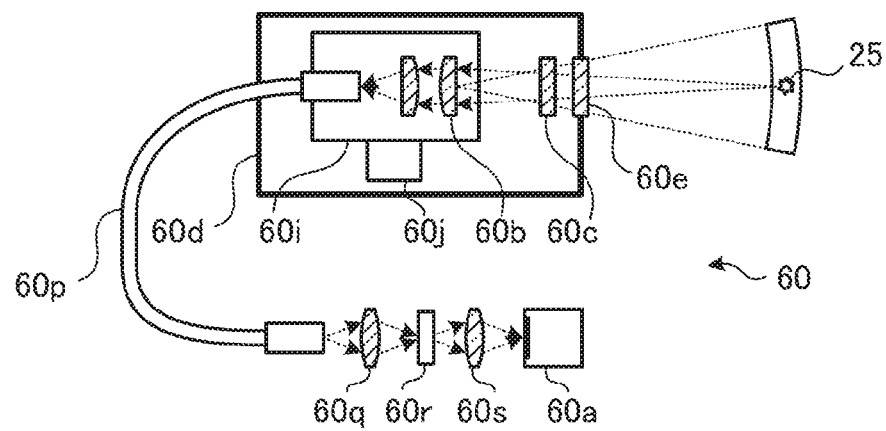
FIGS. 15A and 15B show a target image capturing device of an EUV light generating apparatus according to a sixth embodiment of the present disclosure.
Figure 15B:
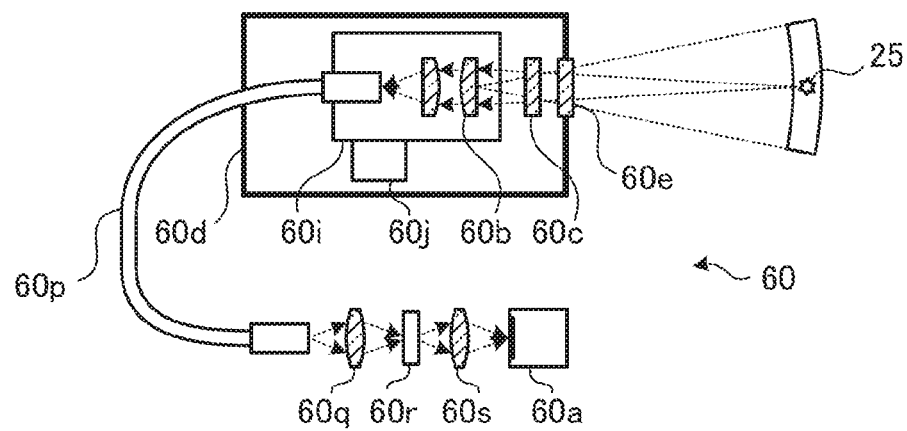

FIGS. 15A and 15B show a target image capturing device 60 of an EUV light generating apparatus according to a sixth embodiment of the present disclosure. In the sixth embodiment, the target image capturing device 60 may include an image conveying fiber 60p. The image conveying fiber 60p may include multiple optical fibers bundled with each other. In the image conveying fiber 60p, an arrangement of the multiple optical fibers may be fixed such that an image formed at a first end is conveyed to a second end.

The first end of the image conveying fiber 60p may be anchored to the plate 60i at a position of an image formed by the transfer optical system 60b. The second end of the image conveying fiber 60p may be fixed to a predetermined position different from the plate 60i.

The image sensor 60a may not be held by the plate 60i. Between the second and of the image conveying fiber 60p and the image sensor 60a, an image transferring optical system 60q, a high-speed shutter 60r, and an image transferring optical system 60s may be arranged in this order.

The image of the object in the focused area conveyed to the second end of the image conveying fiber 60p may further be transferred by the image transferring optical system 60q to a position of the high-speed shutter 60r. The image transferring optical system 60s may be provided such that the image formed at the position of the high-speed shutter 60r is further transferred to a light receiving surface of the image sensor 60a.

The high-speed shutter 60r may be controlled to open and close by the EUV light generation controller 5. An image of the object in the focused area may be formed on the image sensor 60a only when the high-speed shutter 60r is open.

Moving the plate 60i by the actuator 60j for the target image capturing device 60 may cause the transfer optical system 60b and a part of the image conveying fiber 60p including the first end described above to integrally move.

According to the sixth embodiment, only a part of the target image capturing device 60 may be moved. The mass of movable elements may thus be small and the focused area may smoothly be moved. Also, the focused area may precisely be moved.

Further, constraints in a place of installation of the high-speed shutter 60r and the image sensor 60a may be small, and degree of freedom of design may be high.

In other aspects, the sixth embodiment may be substantially the same as the first to fifth embodiments.

10. Simultaneous Capturing of Image of a Plurality of Targets

Figure 16:
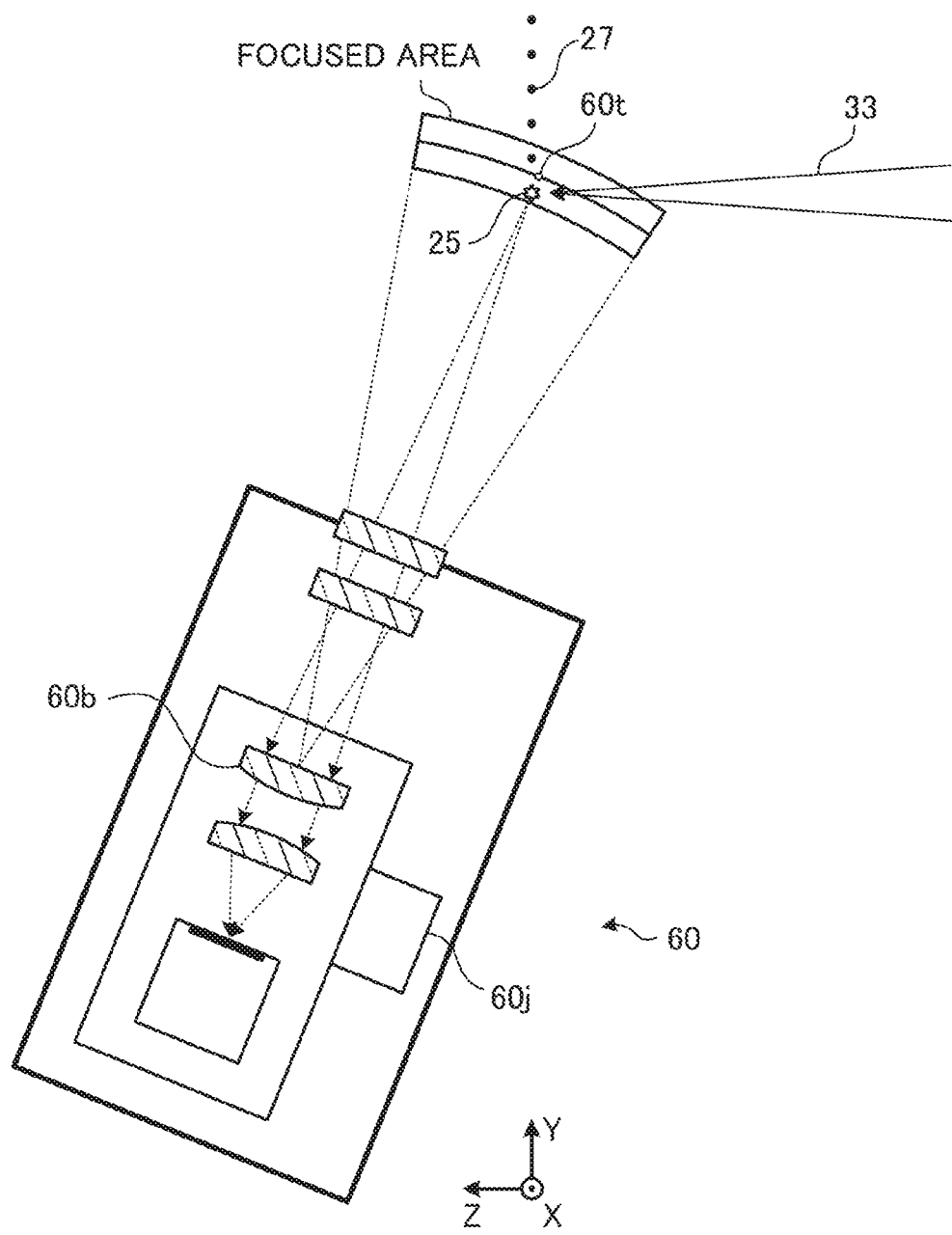
FIG. 16 shows a target image capturing device of an EUV light generating apparatus according to a seventh embodiment of the present disclosure.

FIG. 16 shows a target image capturing device 60 of an EUV light generating apparatus according to a seventh embodiment of the present disclosure. As shown in FIG. 16, the target 27 irradiated with the pulse laser beam 33 may be turned into plasma. After being turned into plasma, the target 27 may be scattered to particles in the chamber 2a. Thus, an image of the target 27 positioned upstream from the plasma generation region 25 in the trajectory of the target may only be captured. If a best focusing position 60t of the transfer optical system 60b coincides with the plasma generation region 25, an image of a target positioned downstream from the best focusing position 60t in the trajectory of the target may not be captured, and a half of the focused area may be wasted.

In the target image capturing device 60 of the seventh embodiment, the best focusing position 60t of the transfer optical system 60b may be positioned upstream from the plasma generation region 25 in the trajectory of the target. A sharp image of a plurality of targets including one target 27 and the next one target 27 may be simultaneously captured. Accuracy in measuring the moving speed of the target may thus be improved. The target 27 measured here may include the droplet or the diffused target at the plasma generation region 25 and may include a plurality of droplets in motion toward the plasma generation region 25. The target image capturing device 60 may simultaneously capture the image of a plurality of droplets and the diffused target.

The above descriptions are intended to be only illustrative rather than being limiting. Accordingly, it will be clear to those skilled in the art that various changes may be made to the embodiments of the present disclosure without departing from the scope of the appended claims.

The terms used in this specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

The invention claimed is:

1. An extreme ultraviolet light generating apparatus, comprising:
   a chamber having a window through which a pulse laser beam enters;
   a target supply unit configured to output at least one target toward a predetermined region in the chamber along a predetermined trajectory;
   a target image capturing device configured to capture an image of the at least one target moving along the predetermined trajectory, the target image capturing device being configured to capture the image in a direction inclined relative to a direction perpendicular to the predetermined trajectory;
   a first actuator configured to move a focused area focused by the target image capturing device; and
   a controller configured to control the first actuator based on a signal from an external device, wherein
   the target image capturing device includes an image conveying fiber, a transfer optical system configured to transfer an image of an object in the focused area to a first end of the image conveying fiber, and an image sensor configured to receive light outputted from a second end of the image conveying fiber, and
   the first actuator moves a part of the image conveying fiber including the first end and the transfer optical system to move the focused area.

2. The extreme ultraviolet light generating apparatus according to claim 1, further comprising:
   a second actuator configured to change the trajectory of the at least one target, wherein
   the controller controls both the first actuator and the second actuator based on the signal from the external device.

3. The extreme ultraviolet light generating apparatus according to claim 1, wherein the signal from the external device is a command to move the predetermined region.

4. The extreme ultraviolet light generating apparatus according to claim 1, further comprising:
   a target position sensor configured to measure a position of the at least one target, wherein
   the signal from the external device is a signal outputted from the target position sensor.

5. The extreme ultraviolet light generating apparatus according to claim 1, wherein the first actuator moves the part of the image conveying fiber including the first end and the transfer optical system along the direction of capturing with the target image capturing device to move the focused area.

6. The extreme ultraviolet light generating apparatus according to claim 1, wherein
   the at least one target includes a plurality of droplets sequentially supplied to the predetermined region, and
   the target image capturing device simultaneously captures an image of one droplet and the next at least one droplet included in the plurality of droplets.

7. The extreme ultraviolet light generating apparatus according to claim 6, wherein the target image capturing device is positioned such that a best focusing position of the transfer optical system is positioned upstream from the predetermined region in the predetermined trajectory.

8. The extreme ultraviolet light generating apparatus according to claim 1, wherein the first actuator integrally moves the part of the image conveying fiber including the first end and the transfer optical system to move the focused area.

9. The extreme ultraviolet light generating apparatus according to claim 1, wherein the target image capturing device further includes a plate that holds the part of the image conveying fiber including the first end and the transfer optical system, and the first actuator moves the plate with the part of the image conveying fiber including the first end and the transfer optical system to move the focused area.

10. The extreme ultraviolet light generating apparatus according to claim 9, wherein a distance of moving the focused area is substantially equal to a distance of moving the plate.

11. An extreme ultraviolet light generating apparatus, comprising:

a chamber having a window through which a pulse laser beam enters;

a target supply unit configured to output at least one target toward a predetermined region in the chamber along a predetermined trajectory;

a target image capturing device configured to capture an image of the at least one target moving along the predetermined trajectory, the target image capturing device being configured to capture the image in a direction inclined relative to a direction perpendicular to the predetermined trajectory;

a first actuator configured to move a focused area focused by the target image capturing device; and a controller configured to control the first actuator based on a signal from an external device, wherein the target image capturing device includes an image sensor configured to receive light and a transfer optical system configured to transfer an image of an object in the focused area to the image sensor, and the first actuator moves the image sensor and the transfer optical system to move the focused area.

12. The extreme ultraviolet light generating apparatus according to claim 11, further comprising:

a second actuator configured to change the trajectory of the at least one target, wherein the controller controls both the first actuator and the second actuator based on the signal from the external device.

13. The extreme ultraviolet light generating apparatus according to claim 11, wherein the first actuator moves the image sensor and the transfer optical system based on a command to move the predetermined region.

14. The extreme ultraviolet light generating apparatus according to claim 11, further comprising:

a target position sensor configured to measure a position of the at least one target, wherein the first actuator moves the image sensor and the transfer optical system based on the position of the at least one target measured by the target position sensor.

15. The extreme ultraviolet light generating apparatus according to claim 11, wherein the first actuator moves the image sensor and the transfer optical system along the direction of capturing with the target image capturing device to move the focused area.

16. The extreme ultraviolet light generating apparatus according to claim 11, wherein the at least one target includes a plurality of droplets sequentially supplied to the predetermined region, and the target image capturing device simultaneously captures an image of one droplet and the next at least one droplet included in the plurality of droplets.

17. The extreme ultraviolet light generating apparatus according to claim 16, wherein the target image capturing device is positioned such that a best focusing position of the transfer optical system is positioned upstream from the predetermined region in the predetermined trajectory.

18. The extreme ultraviolet light generating apparatus according to claim 11, wherein the first actuator integrally moves the image sensor and the transfer optical system to move the focused area.

19. The extreme ultraviolet light generating apparatus according to claim 11, wherein the target image capturing device further includes a plate that holds the image sensor and the transfer optical system, and the first actuator moves the plate with the image sensor and the transfer optical system to move the focused area.

20. The extreme ultraviolet light generating apparatus according to claim 19, wherein a distance of moving the focused area is substantially equal to a distance of moving the plate.

* * * * *